(12) United States Patent
Butt et al.

(10) Patent No.: US 7,465,615 B1
(45) Date of Patent: Dec. 16, 2008

(54) POLYCONDUCTOR LINE END FORMATION AND RELATED MASK

(75) Inventors: Shahid A. Butt, Ossining, NY (US);
Allen H. Gabor, Katonah, NY (US);
Donald J. Samuels, Silverthorne, CO (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/935,714

(22) Filed: Nov. 6, 2007

(51) Int. Cl.
*H04L 21/00* (2006.01)
(52) U.S. Cl. .............. 438/157; 438/592; 257/E21.039
(58) Field of Classification Search .............. 430/5; 438/157, 592; 257/E21.039, E21.236
See application file for complete search history.

(56) References Cited

U.S. PATENT DOCUMENTS

| | | | |
|---|---|---|---|
| 4,343,877 A * | 8/1982 | Chiang | .............. 430/5 |
| 6,034,877 A | 3/2000 | Bronner et al. | |
| 6,430,733 B1 | 8/2002 | Cohn et al. | |
| 6,593,631 B2 * | 7/2003 | Lee et al. | .............. 257/369 |
| 2005/0271949 A1 | 12/2005 | Corboy et al. | |

\* cited by examiner

*Primary Examiner*—W. David Coleman
(74) *Attorney, Agent, or Firm*—Steve Capella; Hoffman Warnick LLC

(57) ABSTRACT

Methods of forming adjacent polyconductor line ends and a mask therefor are disclosed. In one embodiment, the method includes forming a polyconductor layer over an isolation region; forming a mask over the polyconductor layer, the mask including shapes to create the polyconductor line ends and a correction element to ensure a designed proximity of the polyconductor line ends; and etching the polyconductor layer using the patterned photoresist mask to create the adjacent polyconductor line ends, wherein the correction element is removed during the etching.

1 Claim, 7 Drawing Sheets

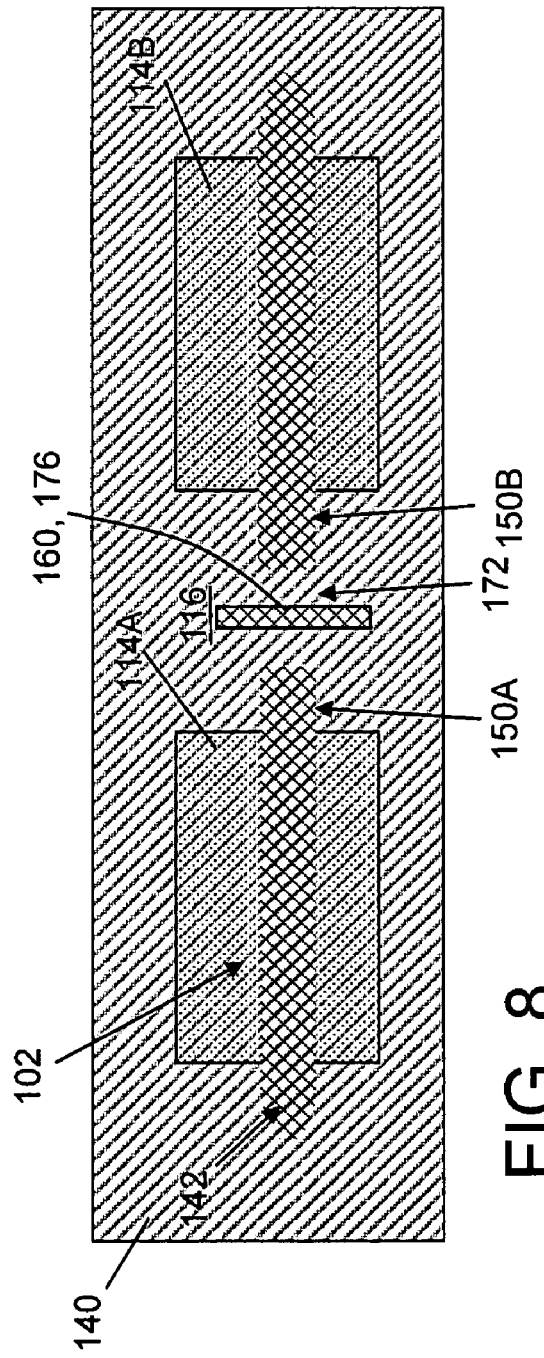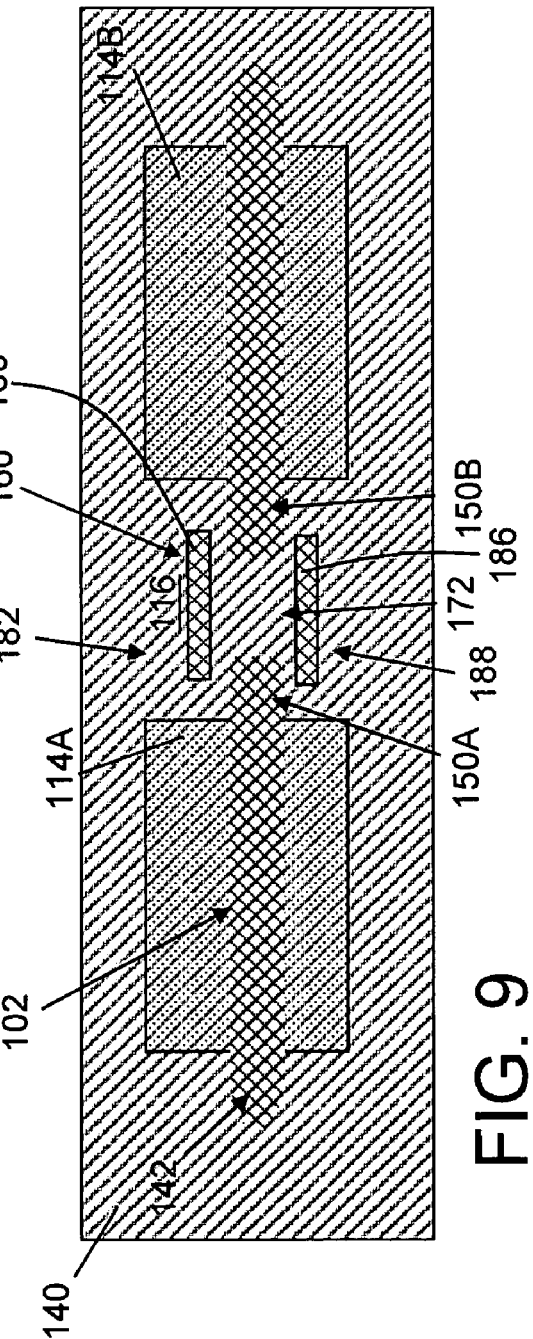

POLYCONDUCTOR LINE END FORMATION AND RELATED MASK

BACKGROUND

1. Technical Field

The disclosure relates generally to integrated circuit (IC) chip fabrication, and more particularly, to methods of forming polyconductor line ends and a memory cell including the polyconductor line ends.

2. Background Art

Memory used in integrated circuit (IC) chips can come in a variety of forms such as static random access memory (SRAM), dynamic random access memory (DRAM), Flash memory, etc. The industry has a continuing drive to shrink memory cells to remain competitive. As one attempts to shrink cells, process constraints can limit the amount of shrinkage. As isolation regions (e.g., shallow trench isolation (STI)) push closer together, the distance that a polysilicon conductor (polyconductor or PC) can extend pass the STI is decreased. The cell dimension is limited by how close one can place to PC lines end-to-end (facing each other or otherwise) on the isolation region. Thus, the performance of a memory cell is directly influenced by the end-to-end space that can be achieved between PC line-ends.

The ability to pattern a small space between PC line-ends has both lithographic and etch limitations. The etch limitations come from the fact that during the trim step (i.e., the process in which the gate critical dimension (CD) that was printed in photoresist is reduced to that which is needed in the final poly) the line-ends trim more than the gates. In particular, as shown in FIG. 1, a specific PC line-end 2 may be targeted to be, for example, 100 nm, past an active region 4 (scenario A) or contact layer 6 (scenario B) into an isolation region 8, but due to limitations of the resist, trim processing and rounding, PC line-end 2 does not end up being 100 nm past the active region 6 or contact layer 8. In some instances, PC line-end 2 is etched back over active region 4. In any event, it is common for a gate length to be incorrect because of this situation. Further scaling magnifies the situation.

There are many methods which are being pursued in the industry to enable the tighter PC line-end spacing. For example, one popular approach includes a double exposure-double etch scheme. In this case, as shown in FIG. 2A, a polyconductor (PC) 12 is exposed and etched over an active region 14 and fully across an isolation region 16 to print a gate 18 (intersection of PC 12 and active region 14), and then another exposure and etch, shown in FIG. 2B, is used to remove polyconductor 12 over the isolation region 16 to form line-ends 22 and, hence, the devices. This approach attains the necessary sizes and precision, however, the cost incurred is significant because of the need for two exposures and two etches for one level. It allows the etch step for opening line-ends 22 to be completely directional (no trim) and also creates PC tips that are relatively less rounded. The rounded line ends trim very quickly during the etch process, which makes controlling the etch difficult.

A second approach, shown in FIGS. 3A-B, attempts to decrease the trim rate of line-ends 22 (FIG. 2B) by printing a bulged region 24 (FIG. 3A) in the resist at a line-end for polyconductor 12 (single exposure, single etch) over isolation region 16. That is, line ends 22 (FIG. 2B) are printed in the resist with bulged region 24 immediately adjacent to active region 14. This approach offers smaller spacing due to the decreased trim of the line-ends, but creates bulbous line-ends 26 (FIG. 3B). Unfortunately, bulbous line-ends 26 usually land on active region 14, which causes undesirable gate 18 length variation along the device. A third approach includes using a double exposure with a single etch. While this approach does not eliminate the etch effects, it allows for a smaller line-end space to be printed in resist if the illumination is optimized for the second exposure. A fourth approach under exposes the PC using a block mask, and uses alternating phase shift masks (Alt PSM) scheme and a break through with etch.

SUMMARY

Methods of forming adjacent polyconductor line ends and a mask therefor are disclosed. In one embodiment, the method includes forming a polyconductor layer over an isolation region; forming a mask over the polyconductor layer, the mask including a shape to create each polyconductor line end and a correction element to ensure a designed proximity of the polyconductor line ends; and etching the polyconductor layer using the patterned photoresist mask to create the adjacent polyconductor line ends, wherein the correction element is removed during the etching.

A first aspect of the disclosure provides a method of forming adjacent polyconductor line ends, the method comprising: forming a polyconductor layer over an isolation region; forming a mask over the polyconductor layer, the mask including a shape to create the polyconductor line ends and a correction element to ensure a designed proximity of the polyconductor line ends; and etching the polyconductor layer using the patterned photoresist mask to create the adjacent polyconductor line ends, wherein the correction element is removed during the etching.

A second aspect of the disclosure provides a mask for forming adjacent polyconductor line ends, the mask comprising: a shape to create each polyconductor line end; and a correction element having a dimension such that the correction element does not print during use of the mask but ensures a designed line end proximity of the polyconductor line ends.

A third aspect of the disclosure provides a method of forming adjacent polyconductor line ends, the method comprising: forming a polyconductor layer over an isolation region; forming a mask over the polyconductor layer, the mask including a shape to create each polyconductor line end and a sub-resolution correction element to ensure a designed proximity of the polyconductor line ends, wherein the sub-resolution correction element exists despite any optical correction; and etching the polyconductor layer using the patterned photoresist mask to create the adjacent polyconductor line ends, wherein the correction element is removed during the etching.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 6-10 show other processes of the embodiments of the method and various embodiments of a mask according to the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Referring to FIGS. 4-10, embodiments of a method of forming adjacent polyconductor line ends 100A-B and a related mask 102 (FIG. 6) are illustrated. The methods and mask 102 take advantage of the large, non-linear etch biases experienced by polyconductor line etching by forming a correction element 160 (FIGS. 6-10) (during lithography) between adjacent polyconductor line ends 100A, 100B that has a size that is less than an etch bias, i.e., {DEFINE ETCH BIAS} sub-resolution. As a result, after etching, the correction element is removed or broken and two adjacent polyconductor line ends 100A, 100B are created with less line end shortening than with a conventional single expose process. Correction elements 160 will be made by introducing sub-resolution features in the gap between polyconductor line ends 100A, 100B, e.g., over an isolation region 116. Since polyconductor line ends 100A-B are so close, what would normally be sub resolution, in fact will print. The embodiments illustrated pertain to forming a memory cell, e.g., static random access memory (SRAM) cell, dynamic random access memory (DRAM) cell, Flash memory, etc. It is understood, however, that the teachings of the disclosure are not limited to formation of a memory cell, and may find applicability to a variety of situations requiring decreased spacing between polyconductor line ends. It is emphasized here that the teachings of the disclosure are apart from optical correction, which may also be provided.

Figure 1:
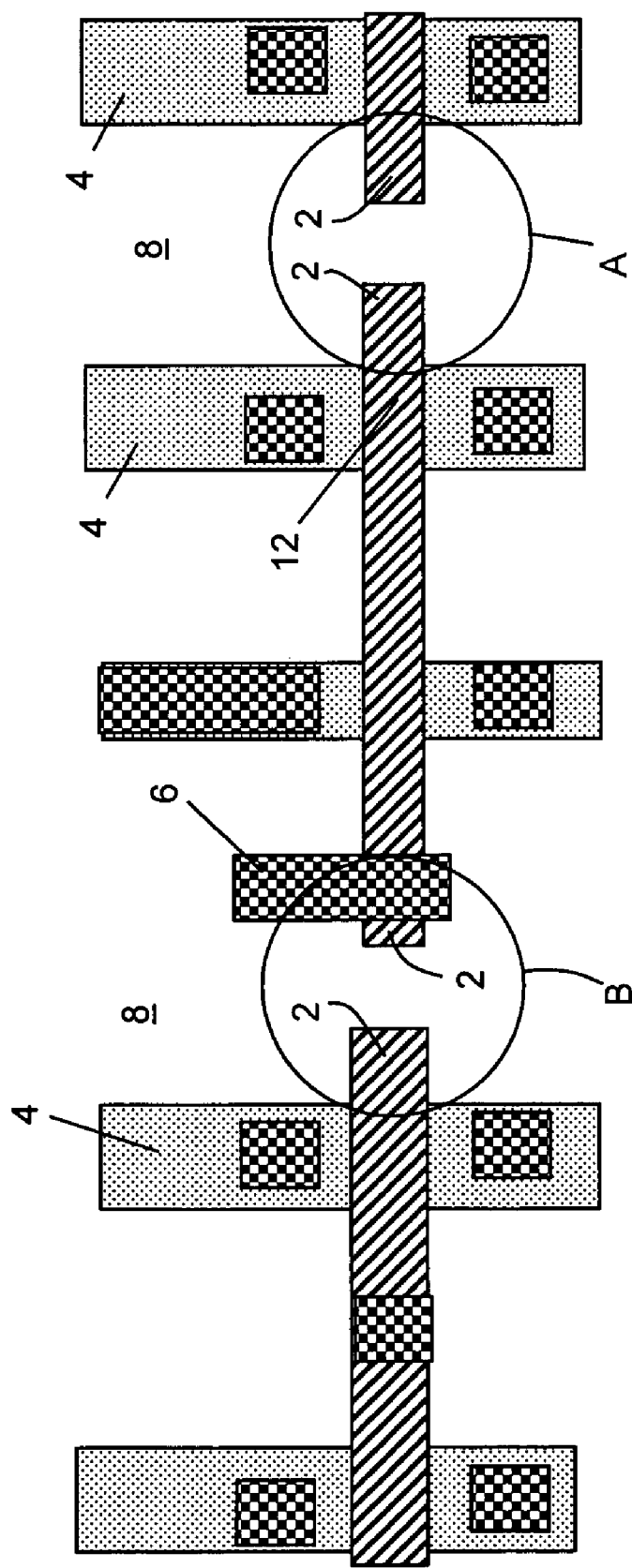
FIG. 1 shows a simplified conventional memory cell.
Figure 2A:
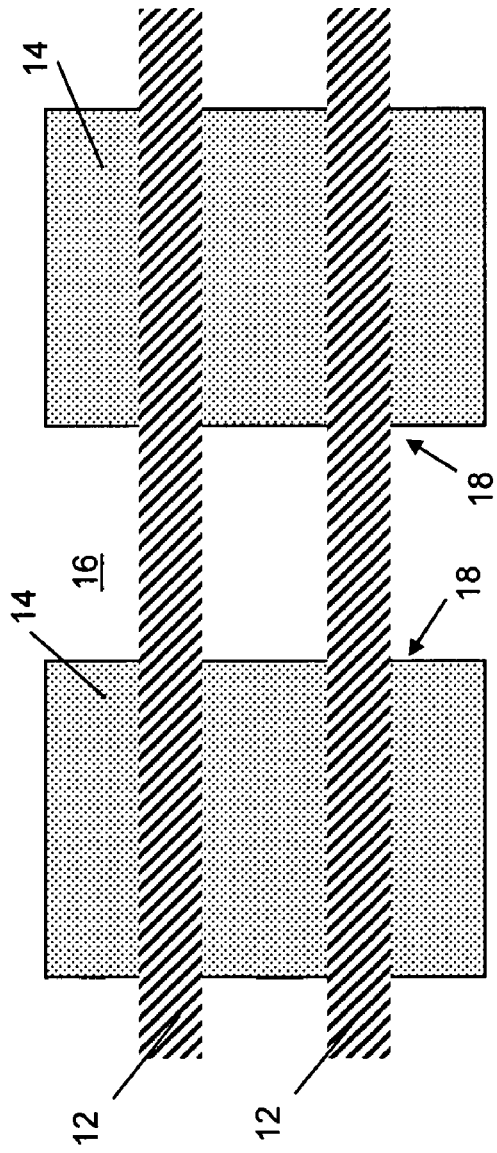
FIGS. 2A-B shows a simplified method of forming polyconductor line ends for a memory cell.
Figure 2B:
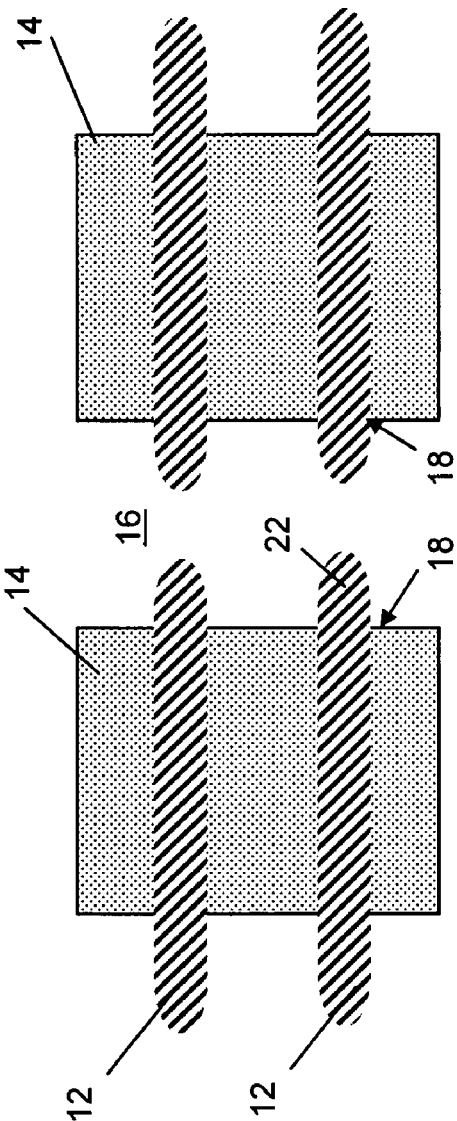
Figure 3A:
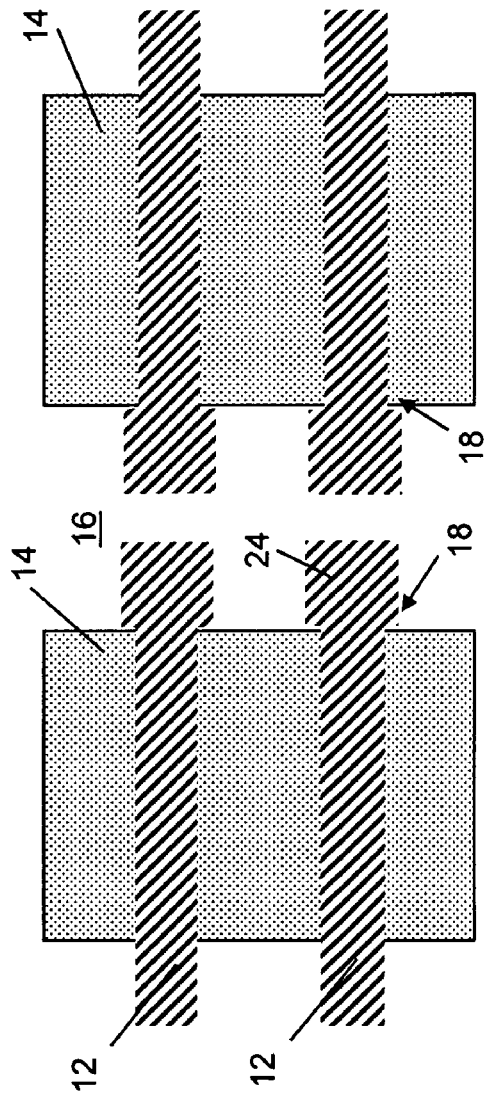
FIGS. 3A-B shows another simplified method of forming polyconductor line ends for a memory cell.
Figure 3B:
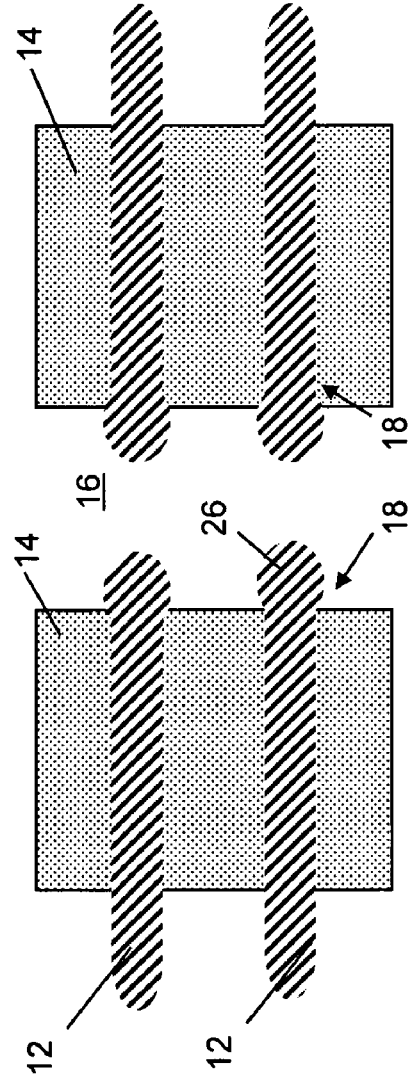
Figure 4:
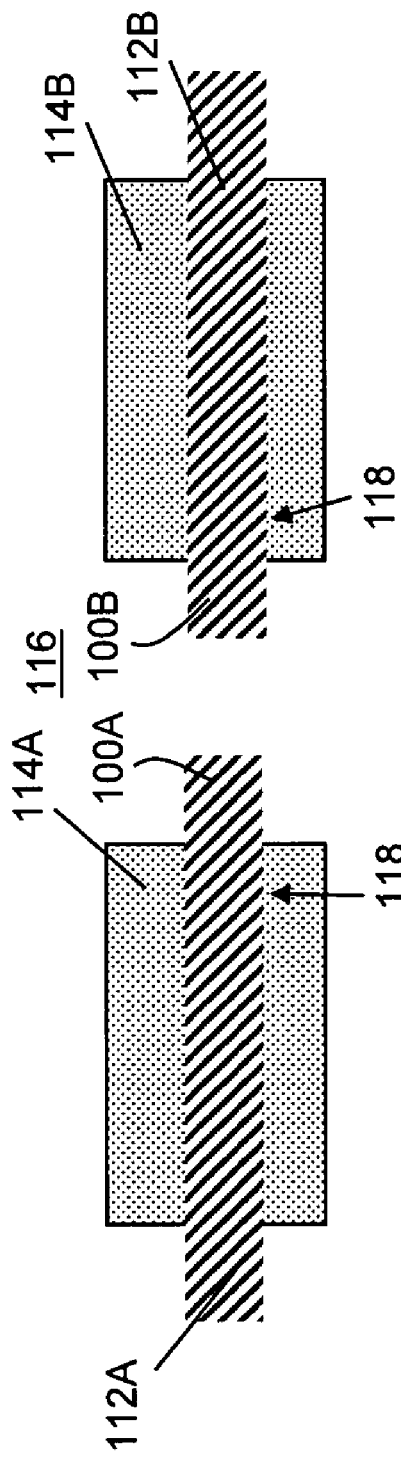
FIG. 4 shows one embodiment of a polyconductor line ends according to an intended design.

FIG. 4 shows one embodiment of polyconductor lines 100A-B over device elements 114A, 114B separated by an isolation region 116. More particularly, FIG. 4 shows polyconductor lines 100A-B as they were designed to be formed, e.g., at a certain distance apart, having square ends, etc. As used herein, a "device element" may include any structure over which a polyconductor line is to extend. In one embodiment, each device element 114A, 114B includes an active region, i.e., a doped silicon region over which a polyconductor line 112A, 112B (two shown) forms a gate 118. In another embodiment, one device element 114A may include an active region, while device element 114B includes a contact element, e.g., a contact via or contact level interconnect (similar to contact layer 6 in FIG. 1). Other device elements may also be possible. Isolation region 116 may include any now known or later developed isolation structure, e.g., a deep trench isolation, a shallow trench isolation, etc., and may include any appropriate dielectric such as silicon dioxide ($SiO_2$). Device elements 114A, 114B and isolation region 116 may be formed using any now known or later develop processes, e.g., silicon deposition, trench formation using photolithography, dielectric deposition, planarization, etc.

Figure 5:
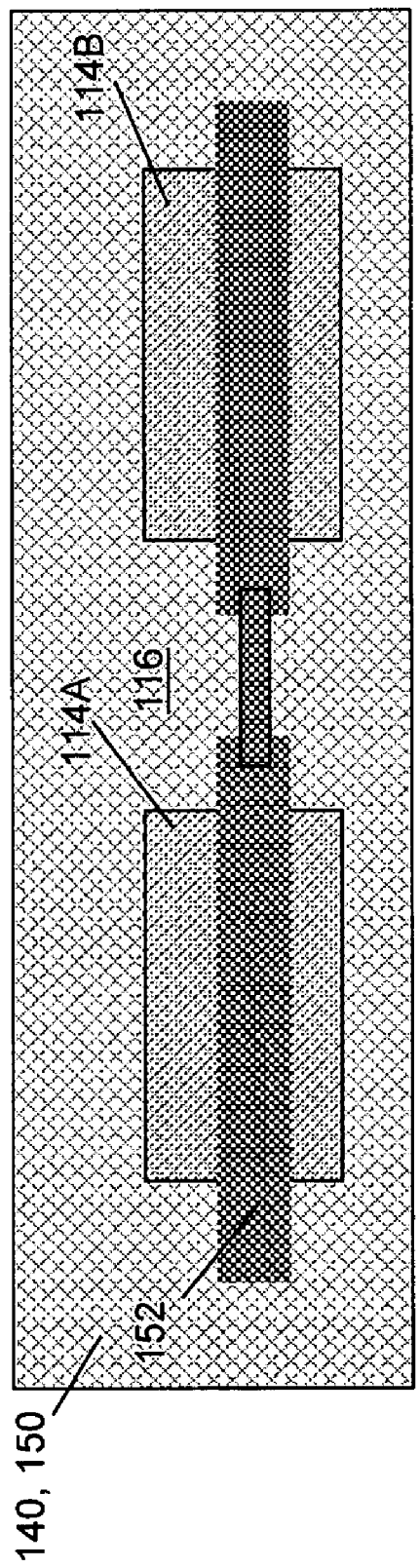
FIG. 5 shows one process according to embodiments of a method according to the disclosure.
Figure 6:
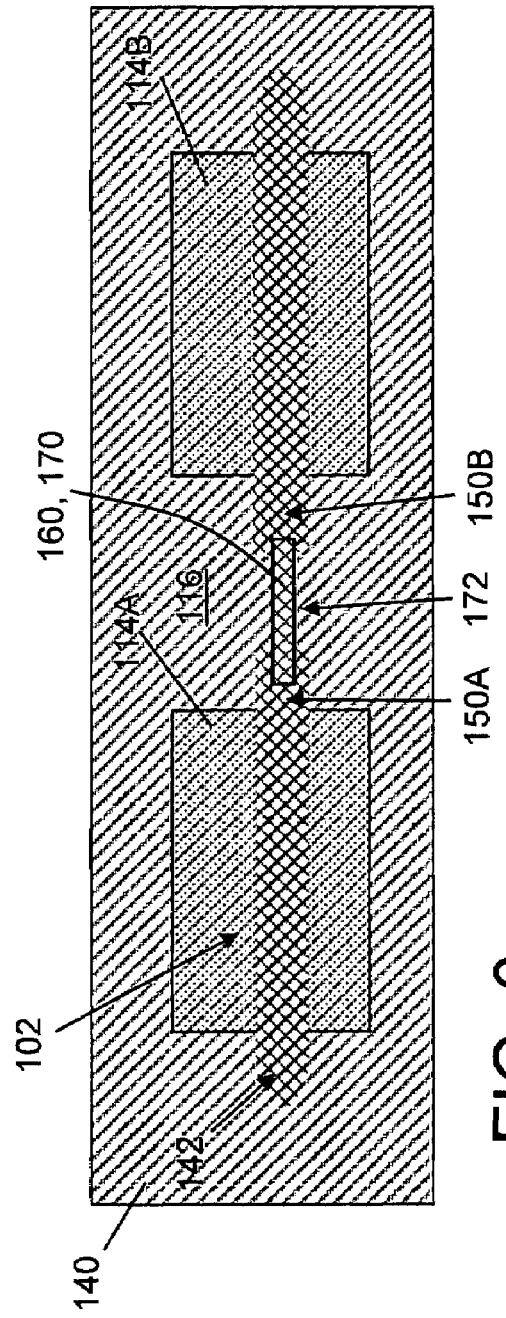

FIG. 5 shows a first process including forming a polyconductor layer 140 over isolation region 116. FIG. 5 also shows a photoresist layer 150 over polyconductor layer 140. (Both polyconductor layer 140 and photoresist layer 150 are shown in a transparent manner so that underlying structures are apparent). Polyconductor layer 140 may include any now known or later developed polycrystalline silicon conductor material, doped or undoped.

FIG. 5 also shows forming mask 102 (FIG. 6) over polyconductor layer 140. This process may include any now known or later developed techniques for generally creating a mask 102. In the example shown, a hardmask 152 is formed (patterned) over photoresist 150, and the photoresist is etched to form mask 102. Mask 102 is used to etch polyconductor layer 140. FIG. 5 shows only one embodiment of shapes used in mask 102 in FIG. 6. It is understood, however, that other hardmask 152 shapes may be used to form other mask 102 shapes such as those shown in FIGS. 7-10.

With reference to FIG. 4 and FIGS. 6-10, mask 102 includes a shape 150A, 150B to, among other things, create a polyconductor line ends 100A, 100B and a correction element 160 to ensure a designed line end proximity of polyconductor line ends 100A, 100B. Correction element 160 is a sub-resolution feature and may be introduced during conventional optical proximity correction (OPC) processing flow. OPC is a process that attempts to normalize images on a mask to attain desired space to accommodate the diffraction problems caused by shapes printing smaller than the wavelength of light used for photolithography. Correction element 160 exists despite any optical proximity correction, i.e., it is not created as part of or removed by OPC. As shown in FIG. 4, OPC should give: a) a square end to line ends 100A, 100B, and b) lines ends 100A, 100B that extend past device elements 114A, 114B, because that is what a designer intended. In reality, neighboring shapes present constraints as to how far OPC can move shapes, so polyconductor line ends 100A, 100B end up too short and not square. Correction element 160 provides OPC processing a target to force line ends 100A, 100B to bridge, and exists despite OPC. Correction element 160 can either be put in before OPC and OPC is allowed to see the feature, or correction element 160 can be put in either before or after OPC, but OPC is not allowed to see the feature.

Figure 7:
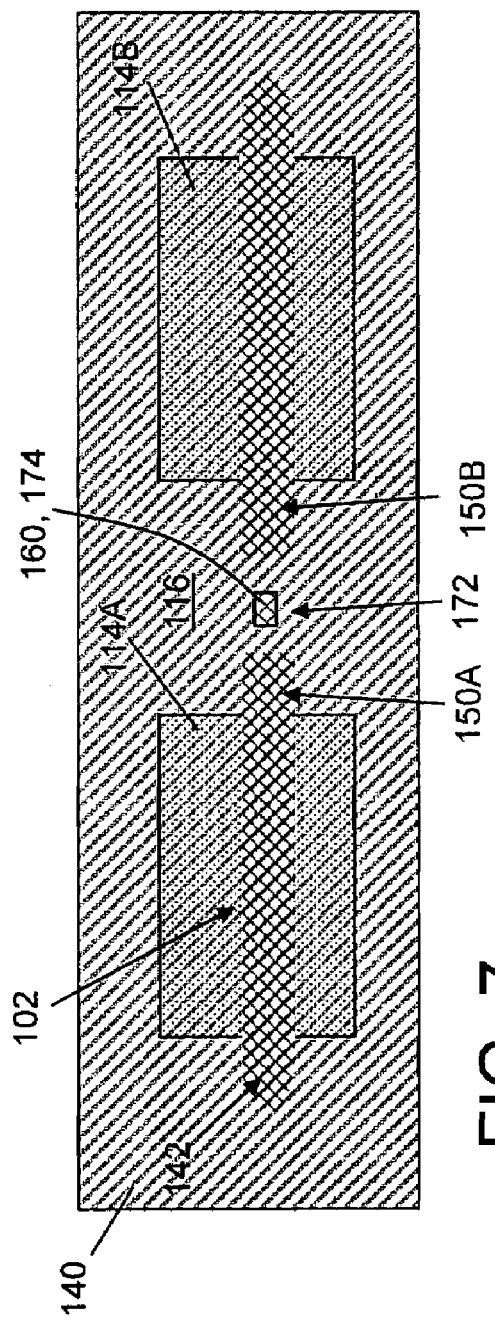
Figure 10:
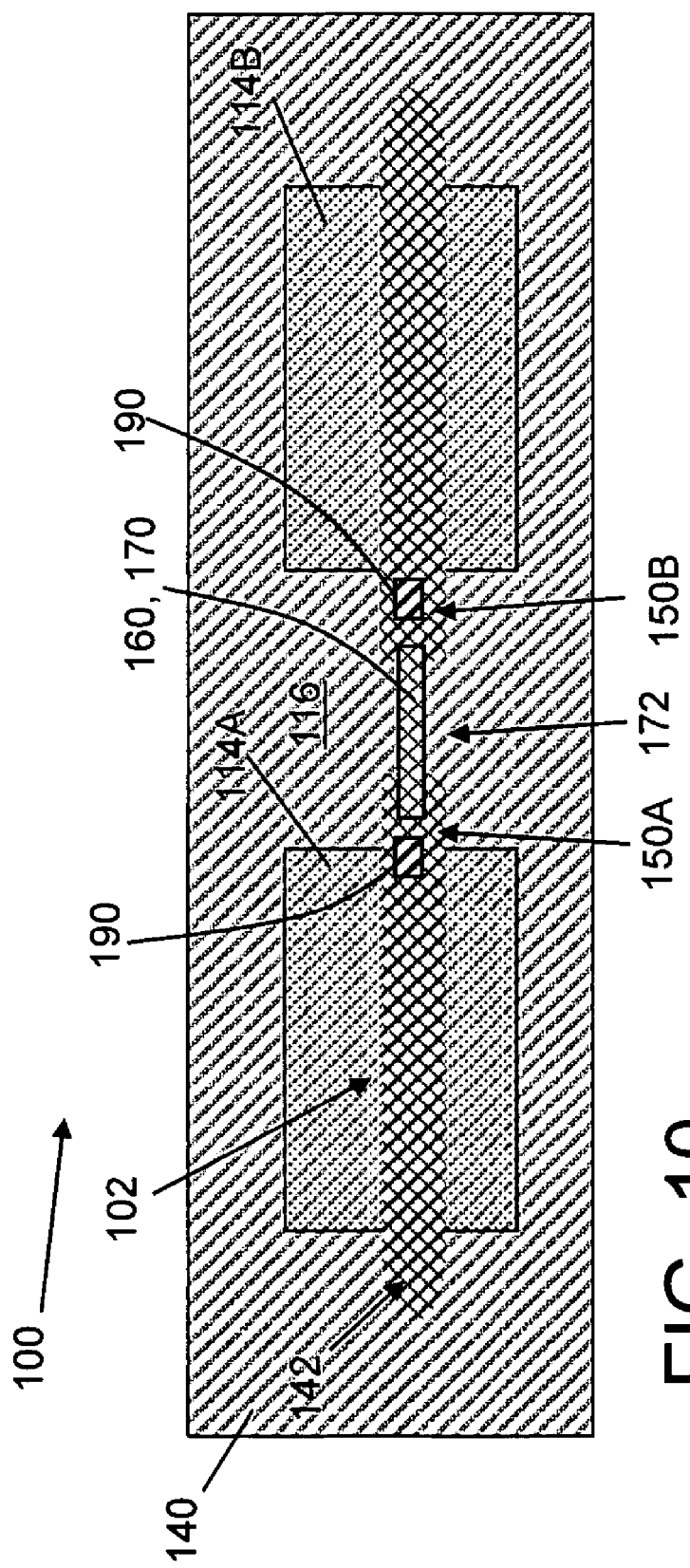

Each of FIGS. 6-10 shows an embodiment of correction element 160. Note that in FIGS. 6-10, correction element 160 includes a border for clarity of illustration purposes only. In the FIG. 6 embodiment, correction element 160 includes a bridge element 170 spanning an opening 172 between each shape 150A, 150B of mask 102 for polyconductor line ends 100A, 100B. FIG. 7 shows correction element 160 including an island 174 positioned in opening 172 between each shape 150A, 150B of mask 102 for polyconductor line ends 100A, 100B. FIG. 8 shows correction element 160 including an element 176 extending substantially perpendicularly to each shape 150A, 150B of mask 102 for polyconductor line ends 100A, 100B in opening 172 between each shape 150A, 150B of mask 102 for the polyconductor line ends 100A, 100B. FIG. 9 shows correction element 160 including a first element 180 positioned to a first side 182 of opening 172 between each shape 150A, 150B of mask 102 for polyconductor line ends 100A, 100B and laterally overlapping each shape 150A, 150B, and a second element 186 positioned to a second side 188 of opening 172 and laterally overlapping shapes 150A, 150B. FIG. 10 shows an alternative embodiment that shown in FIG. 6. In this embodiment, correction element 160 includes bridge element 170 spanning opening 172 between each shape 150A, 150B of mask 102 for polyconductor line ends 100A, 100B, and each shape 150A, 150B includes a void 190. Voids 190 extend to polyconductor layer 140.

In either embodiment, mask 102 for forming adjacent polyconductor line ends 100A, 100B includes a shape 150A, 150B to create each polyconductor line end 100A, 100B, and correction element 160 having a dimension such that the correction element does not print during use of the mask but ensures a designed line end proximity of the polyconductor line ends.

Etching of polyconductor layer 140 using patterned photoresist mask 102 creates the adjacent polyconductor line ends 100A, 100B, as shown in FIG. 4. As also shown in FIG. 4, correction element 160 is removed during the etching. The etching may use any now known or later developed etching process such as reactive ion etching (RIE).

The methods and mask as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method of forming adjacent polyconductor line ends, the method comprising:
    forming a polyconductor layer over an isolation region;
    forming a mask over the polyconductor layer, the mask including a shape to create the polyconductor line ends and a sub-resolution correction element to ensure a designed proximity of the polyconductor line ends; and
    etching the polyconductor layer using the patterned photoresist mask to create the adjacent polyconductor line ends, wherein the sub-resolution correction element is removed during the etching,
    wherein the sub-resolution correction element exists despite any optical proximity correction (OPC), and
    wherein the sub-resolution correction element includes an island positioned in an opening between each shape of the mask for the polyconductor line ends.

* * * * *